United States Patent
Jeddeloh (10) Patent No.: US 7,020,815 B2
(45) Date of Patent: Mar. 28, 2006

(54) MEMORY TECHNOLOGY TEST APPARATUS

(75) Inventor: Joseph M. Jeddeloh, Shoreview, MN (US)

(73) Assignee: Micron Technology, Inc., Boise, ID (US)

( * ) Notice: Subject to any disclaimer, the term of this patent is extended or adjusted under 35 U.S.C. 154(b) by 566 days.

(21) Appl. No.: 10/230,211

(22) Filed: Aug. 29, 2002

(65) Prior Publication Data

US 2004/0044933 A1 Mar. 4, 2004

(51) Int. Cl.
*G11C 29/00* (2006.01)
*G06F 11/00* (2006.01)

(52) U.S. Cl. ........................................ 714/718; 714/738

(58) Field of Classification Search ................ 714/711, 714/710, 718, 719, 721, 733, 734, 735, 736, 714/819, 820, 824, 25, 30, 31, 37, 38, 39, 714/42, 48, 49, 54; 702/108, 117, 119, 120; 713/401, 500, 600
See application file for complete search history.

(56) References Cited

U.S. PATENT DOCUMENTS

| | | | |
|---|---|---|---|
| 5,513,315 A * | 4/1996 | Tierney et al. | 714/37 |
| 5,673,271 A * | 9/1997 | Ohsawa | 714/718 |
| 6,285,962 B1 | 9/2001 | Hunter | |
| 6,567,941 B1 * | 5/2003 | Turnquist et al. | 714/724 |
| 2002/0046374 A1 | 4/2002 | Aoki et al. | |
| 2004/0153274 A1 * | 8/2004 | Fukuda | 702/117 |

* cited by examiner

*Primary Examiner*—Christine T. Tu
(74) *Attorney, Agent, or Firm*—Dickstein Shapiro Morin & Oshinsky LLP (57) ABSTRACT

A programmable control device that creates an environment for controlling, testing and evaluating memory designs. The control device provides automated testing of address eyes, data eyes and voltage margins. The control device interfaces with a conventional computer system, such as a personal computer (PC). The computer system gathers test data and outputs the data in a graphical format if desired. Since the control device is quickly re-programmable, new memory sequencing, control, timing and power techniques are rapidly proto-typed in an inexpensive and timely manner.

40 Claims, 6 Drawing Sheets

MEMORY TECHNOLOGY TEST APPARATUS

FIELD OF THE INVENTION

The present invention relates generally to memory devices and, more particularly to a mechanism for testing and evaluating current and new memory technologies.

BACKGROUND OF THE INVENTION

As processor speeds continue to increase, memory system designers are under increasing pressure to create memory devices that can input and output data at increasingly faster rates. As such, new memory system designs are constantly being proposed, tested and, if satisfactory, manufactured.

Double data rate (DDR) synchronous dynamic random access memory (SDRAM) devices are a relatively new form of memory device that was designed to help bridge the gap between processor and memory speeds. During read operations, DDR SDRAM devices return a data clock signal (or data strobe) along with the data, and this data clock signal is used to clock the data into the processor (or into a memory controller attached to the processor). The strobe is typically supplied at two times the rate of the system clock, hence the name DDR. These memories differ from conventional memory systems, which rely on the system clock to latch data received during read operations. Similarly, during write operations the data strobe is used to signify the arrival of the data to be written into the DDR SDRAM.

Designing a DDR SDRAM and an interface for the DDR SDRAM, as well as other high speed memory devices currently being developed, is a complex, time consuming and expensive process. Clock skews may adversely effect data and address eyes (i.e., the short period of time in which the data and address information is reliable/valid). If the skew is large enough, a clock edge that is used to latch the data can move from the center of the data eye into a transitional region or into another data eye. This may cause spurious data to be used during read or write operations. In addition, voltage margins may adversely effect the operation of the DDR SDRAM and its power consumption. These problems must be addressed prior to the final implementation and packaging of the new memory product.

Initially, the new memory device, which may comprise memory, a controller, power supply, and other address, timing and control logic/circuitry must be designed and prototyped. The prototype is then tested and evaluated. Problems such as clock skew, for example, are investigated. Proposed solutions are incorporated in a redesign. The newly re-designed device is prototyped, tested and evaluated until satisfactory results are achieved. This process is expensive and time consuming. For each re-design, new control, timing and address logic may be required, designed, manufactured and tested. Likewise, supply and reference voltages may also be redesigned, manufactured and tested. Prior versions of the device are scrapped. As can be appreciated, the development of new memory devices takes a substantial amount of time, is expensive, wasteful and inefficient.

Accordingly, there is a desire and need for a mechanism for testing and evaluating memory technology in a quick, flexible, efficient and inexpensive manner.

SUMMARY OF THE INVENTION

The present invention provides a mechanism for testing and evaluating memory technology in a quick, flexible, efficient and inexpensive manner.

The above and other features and advantages are achieved by a programmable control device that creates an environment for controlling, testing and evaluating memory designs. The control device provides automated testing of address eyes, data eyes and voltage margins. The control device interfaces with a conventional computer system, such as a personal computer (PC). The computer system gathers test data and outputs the data in a graphical format if desired. Since the control device is quickly re-programmable, new memory sequencing, control, timing and power techniques are rapidly proto-typed in an inexpensive and timely manner.

BRIEF DESCRIPTION OF THE DRAWINGS

The foregoing and other advantages and features of the invention will become more apparent from the detailed description of exemplary embodiments provided below with reference to the accompanying drawings in which.

DETAILED DESCRIPTION OF PREFERRED EMBODIMENTS

In the following detailed description, reference is made to various specific embodiments in which the invention may be practiced. These embodiments are described with sufficient detail to enable those skilled in the art to practice the invention, and it is to be understood that other embodiments may be employed, and that structural and electrical changes may be made without departing from the spirit or scope of the present invention.

The following description is made with reference to DDR SDRAM technology. It should be appreciated, however, that the test board and control device of the present invention may be utilized with any current and future memory technology and that the invention is not to be limited to any specific form of memory (such as a DDR SDRAM). In fact, one of the objectives of the invention is to aid in the development of new technology by simplifying the testing, evaluation and prototyping of new memory devices.

Figure 1:
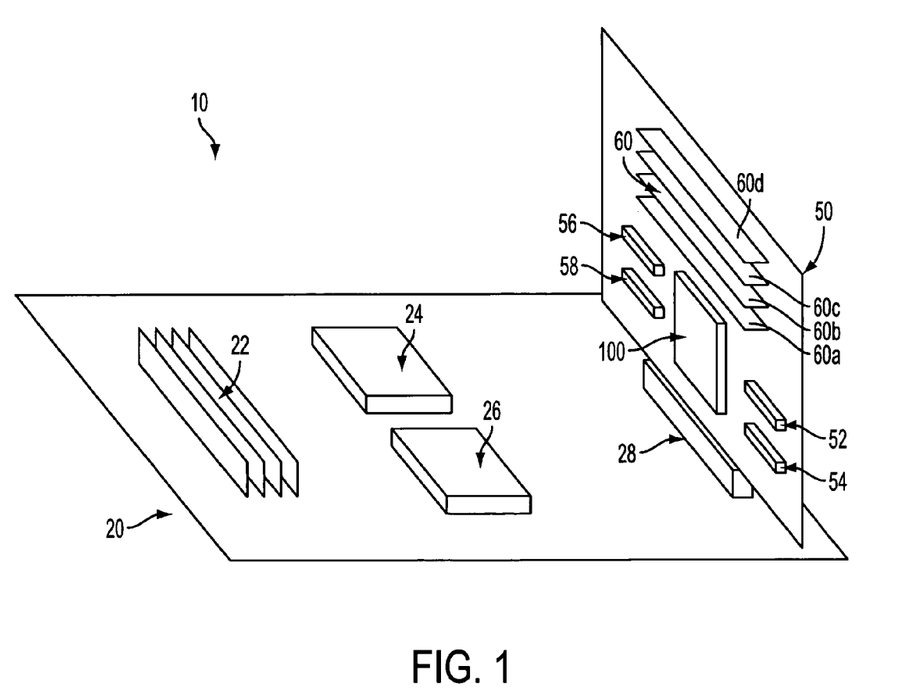
FIG. 1 is a diagram illustrating an exemplary test system comprising a test circuit board implementing a control device constructed in accordance with an embodiment of the invention.

FIG. 1 illustrates an exemplary test system 10 constructed in accordance with an embodiment of the present invention. The system 10 comprises a conventional computer system backplane 20 and a test circuit board 50. The test board 50 includes a control device 100 constructed in accordance with an embodiment of the invention.

The backplane 20 comprises system memory 22, which typically is one form of random access memory, a microprocessor 24 and a connector 28. In the illustrated embodiment, the connector 28 is a peripheral component interconnect (PCI) connector adapted to receive a circuit board (e.g., test circuit board 50) having a PCI edge connector. The backplane 20 may contain additional conventional memory, such as a read only memory (ROM), control circuitry 26, buses, bridges and interfaces such that the backplane 20 may serve as a PC host for the test system 10. In a desired embodiment, the backplane 20 is connected to a monitor for displaying graphical information (described below in more detail with respect to FIG. 6) and other input/output devices such as a keyboard, mouse, etc.

The test board 50 is connected to the backplane 20 via the PCI connector 28. The test board 50 contains a control device 100, a plurality of status/control connectors 52, 54, 56, 58 and memory modules 60a, 60b, 60c, 60d (collectively referred to herein as "memory modules 60"). The memory modules 60 are dual in-line memory modules (DIMM) or single in-line memory modules (SIMM) devices. In a desired embodiment, the memory modules 60 are DDR SDRAM modules. It should be appreciated, however, that the type or number of memory modules 60 is irrelevant and that the invention is not to be limited to any specific type or number of memory modules 60.

The test board 50 is designed to test and collect data, address and voltage information for new and existing memory designs and interfaces (including the memory modules 60). Status and control information may be input to, or output from, the test board 50 via the status/control connectors 52, 54, 56, 58. These connectors 52, 54, 56, 58 may be hooked up to test equipment that is typically used to test circuit boards and, in particular, memory devices. The connectors 52, 54, 56, 58 may be used to input information, such as test and control information and data, and may also be used to output information such as test results, data and status information.

In addition, status, test results, data and other necessary information may be sent from the test board 50 to the backplane 20 for graphical display, storage on a mass storage device, printing, further evaluation, etc. (see FIG. 6). The information is sent via the PCI connector 28. In a desired embodiment, the test board 50 is configured as a PCI target, whereas the backplane 20 is configured as the PCI master. PCI communications and functionality are well known in the art and are not discussed further for brevity purposes.

The control device 100 is the main component of the test board 50. The control device 100 serves as a controller for the test board 50 and, in particular, the memory modules 60. As will be discussed below in more detail, the control device 100 provides automated testing of address eyes, data eyes and voltage margins as well as any other memory feature/function deemed necessary by the DDR SDRAM developer. Since the control device 100 is quickly re-programmable, new memory sequencing, control, timing and power techniques are rapidly proto-typed in an inexpensive and timely manner.

Figure 2:
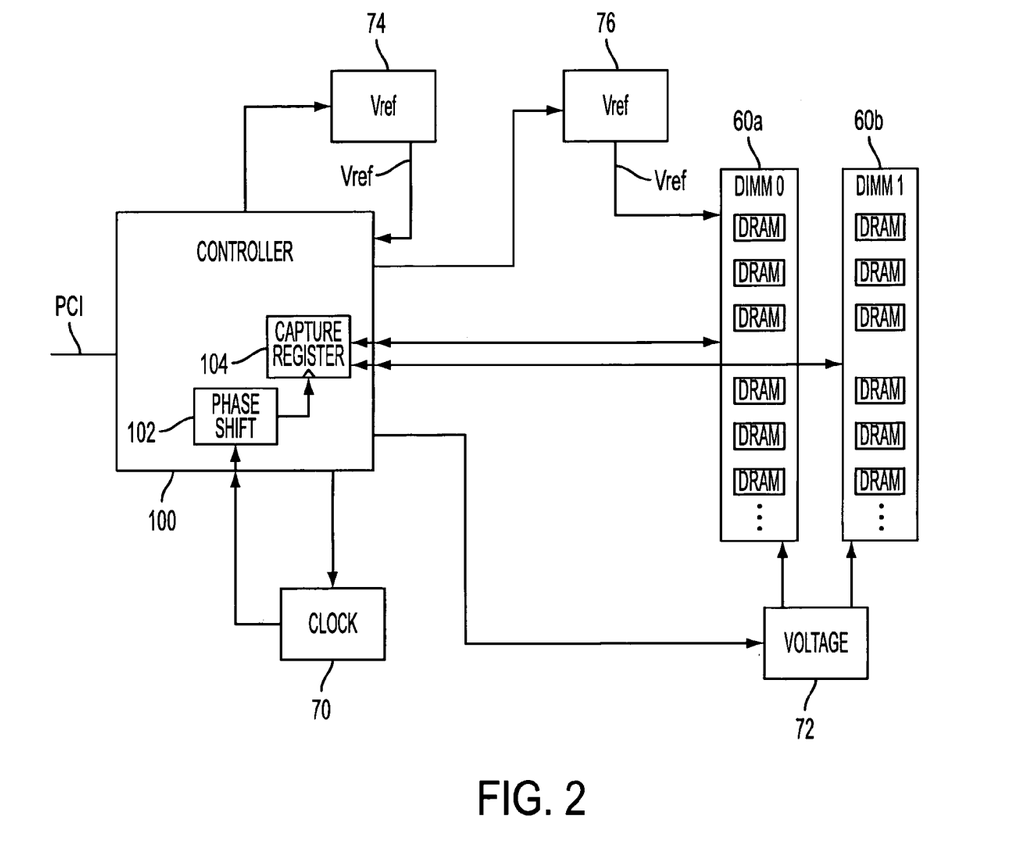
FIG. 2 is a block diagram illustrating exemplary voltage and timing feedback and control concepts for the test circuit board and control device illustrated in FIG. 1.

FIG. 2 is a high level block diagram illustrating exemplary voltage and timing feedback and control circuitry residing on the test circuit board 50 illustrated in FIG. 1. This additional circuitry comprises a clock 70, supply voltage 72 and two reference voltage generators 74, 76 all of which may be controlled by the control device 100. The clock 70 generates clock signals that are input into a phase shift circuit 102. The output of the phase shift circuit 102 is used as a clock signal for a capture register 104. The capture register 104 is electrically connected to memory modules 60a, 60b. It should be appreciated that if the test circuit board contained additional memory modules (e.g., memory modules 60c, 60d illustrated in FIG. 1), then these additional memory modules would also be electrically connected to the capture register 104.

The supply voltage 72 serves as the power source for the memory modules 60a, 60b. The first reference voltage generator 74 outputs a reference voltage Vref that is fed back into the control device 100. This feedback reference voltage Vref provides an indication as to what the memory modules are using as a voltage reference and may be used by the control device 100 or other test circuitry to determine and adjust voltage margins. The second reference voltage generator 76 outputs a reference voltage Vref to the first memory module 60a. Although not illustrated in FIG. 2, the second reference voltage generator 76 may also output a reference voltage Vref to the second memory module 60b. The memory modules 60a, 60b may use the reference voltage Vref to determine data bit values during data sensing, writing and reading operations.

During testing, control, status, data, address, timing and voltage information may be sent from the memory modules 60a, 60b to the capture register 104. This is additional information that is fed back to the control device 100. Once in the capture register 104, the various pieces of feedback information may be used to alter the timing of the memory circuitry to ensure that address and data eyes are correct. The captured information may also be used to determine whether the supply or reference voltages need adjusting. The control device 100 controls the clock 70, supply voltage 72 and reference voltage generators 74, 76. Because the control device 100 is easily re-programmable, any necessary adjustments may be made rather easily. That is, the same board may be "re-proto-typed" without the expense of designing and manufacturing a new physical test board.

Figure 3:
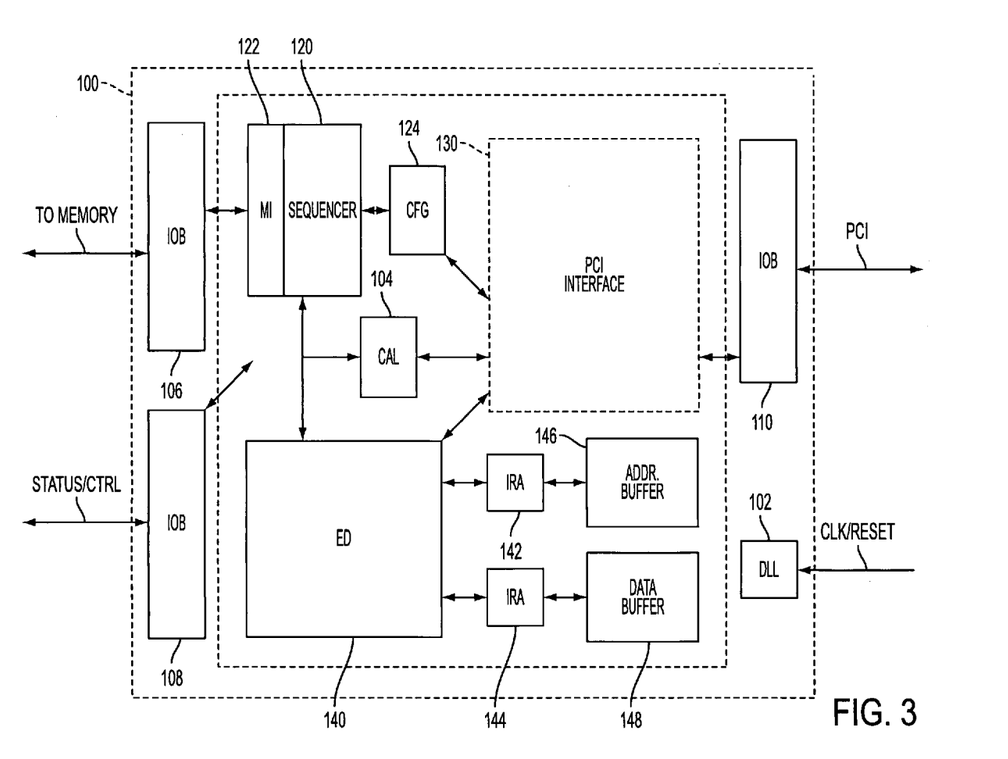
FIG. 3 is a block diagram illustrating an exemplary control device constructed in accordance with an embodiment of the invention.

FIG. 3 is a block diagram illustrating an exemplary control device 100 constructed in accordance with an embodiment of the invention. In a desired embodiment, the control device 100 is implemented in a field programmable gate array (FPGA) such as the XILINX® VIRTEX-II FPGA device. Using an FPGA device allows the control device 100 to be readily re-programmable. This makes the design of the control device 100, test board 50 (FIG. 1) and new memory concept extremely flexible, cost efficient and less time consuming than what is currently being done in the art. It should be appreciated, however, that other programmable devices similar to an FPGA could be used as the control device 100 as long it is capable of being configured in the manner described below and as long as it is capable of performing the functions necessary to carry out the invention.

Generally, the control device 100 consists of four major components: an embedded programmable DMA engine/controller (ED) 140, memory sequencer 120, PCI interface 130 and configuration and control component (CFG) 124. The other components of the control device 100 include a memory interface (MI) 122, capture analyzer listing (CAL) buffer 104, internal RAM arrays (IRA) 142, 144, an address buffer 146 and a data buffer 148. Input/output buffers (IOB) 106, 108, 110 may be used to buffer information from external components, but are not mandatory to practice the invention. Similarly, delay lock loop (DLL) circuitry 102 may be used to receive and delay clock and reset signals.

The DMA engine 140 is a high speed device and is capable of generating any memory bus pattern desired. It also has random request spacing, address and data pattern capability. The DMA engine 140 may be operated in a very controlled or a random mode. The DMA engine 140 is responsible for generating requests to the memory sequencer 120 and checking the return data. The DMA engine 140 will also use the internal RAM arrays 142, 144 to retain trace history and compare information. The patterns used by the DMA engine 140 may be stored in the address and data buffers 146, 148.

The DMA engine 140 is used to perform high speed DMA transfers between external and internal memory sources. The DMA engine 140 also allows access to these memory sources via a PCI access port interface (not shown). DMA commands are programmed into local memory using a linked list data structure (described below with respect to FIG. 4). The DMA engine 140 will traverse the linked list performing high-speed data transfers and data compares. The DMA engine 140 may generate random data, random addresses, and randomly distribute the inter-arrival times of memory requests, making the DMA engine 140 an ideal mechanism to test new memory technologies in real world conditions.

The DMA engine 140 is programmed through a data structure that exists in one or more memory spaces within the control device 100. The data structure consists of some number of command blocks that provide information necessary to perform data transfer operations. In a desired embodiment, each of these command blocks is connected through a series of address pointers to form a linked list. The address of the first command block in the linked list is programmed through the I/O (input/output) space. The DMA engine 140 is instructed to fetch and execute the first command block through an I/O space command register. After performing the requested data operation, an address pointer in the first command block is used to fetch the second command block. An address pointer in each successive command block is used to fetch and execute the next command block, forming a linked list.

Figure 4:
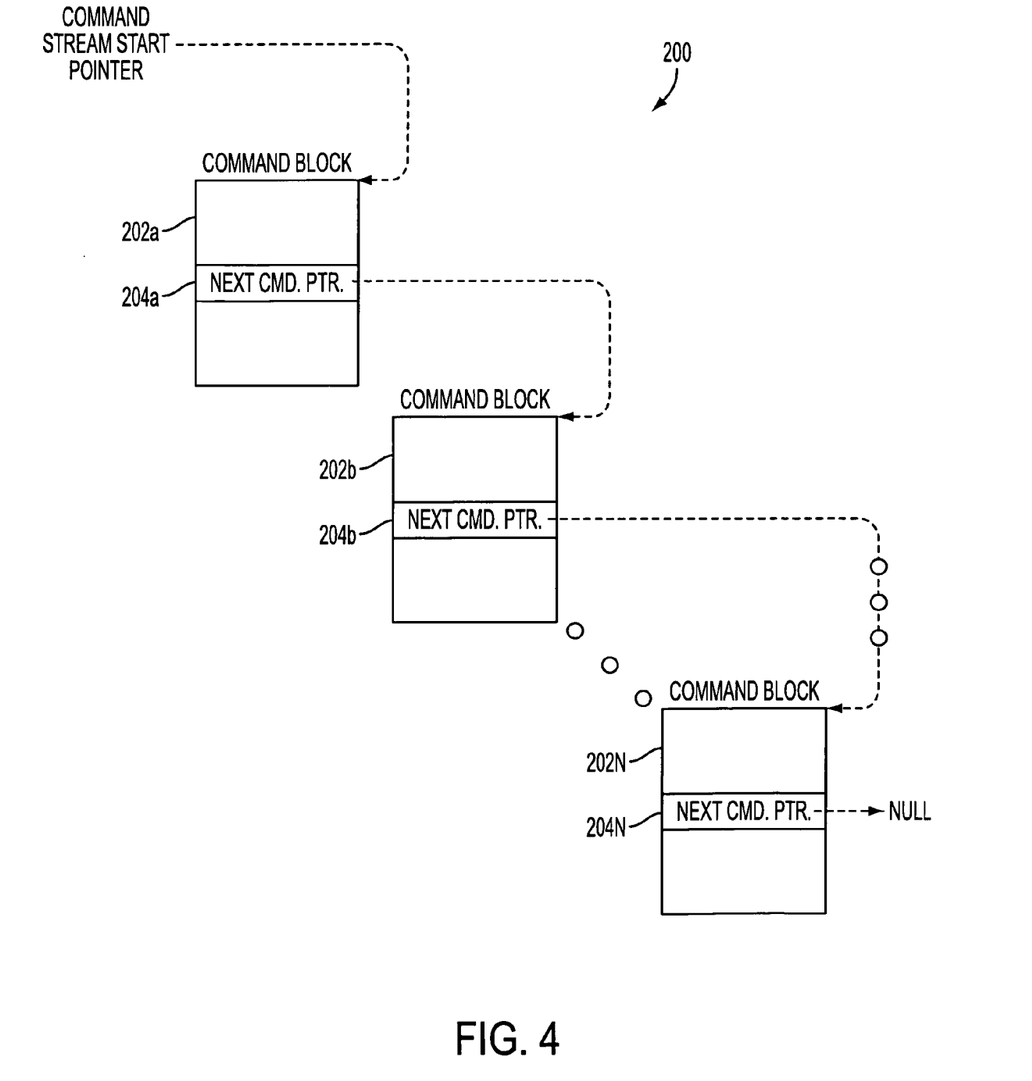
FIG. 4 is a diagram illustrating an exemplary command list utilized by the control device illustrated in FIG. 3.

The linked list forms a command stream for the DMA engine 140. FIG. 4 illustrates a generalized command stream 200. Each command block 202a, 202b, . . . 202n contains information necessary to perform a given data operation. Each command block 202a, 202b, . . . 202n contains an address pointer 204a, 204b, . . . 204n for pointing to the next command block 202a, 202b, . . . 202n in the command stream 200. The starting address for the first command block (e.g., 202a) in a command stream 200 is programmed through the I/O space. The first command block 202a is fetched and executed when a start bit or execute command bit is set in the command register. The current command block (e.g., 202a) contains an address pointer to the next command block (e.g., 202b). Each command block 202a is successively fetched and executed by following the address pointers. The link list is terminated when a NULL pointer is encountered.

A NULL pointer may be defined, for example, as an address consisting of all ones. Upon detecting the NULL pointer, command block execution will halt, and a status bit will be set, indicating the command stream has terminated. Other status bits will indicate if the command stream 200 has terminated normally with no errors, or abnormally due to errors. The status information may optionally generate an interrupt to the host.

A command block is a data structure with enough information to perform a data operation. Data operations are generally variants of the "Move" and "Verify" commands. The Move command transfers a block of data from one location in memory to another by reading from one memory location, and writing to another. The Verify command will compare data from two sources and detect data miscompares by reading from two memory locations. A data count field may be used to specify the number of bytes to be transferred. Other commands may include the ability to set hardware breakpoints and requests for status information (i.e., error status reporting).

Two types of memory addressing may be used, direct and indirect. Direct addressing will use an absolute address to reference memory. Indirect addressing will use one address pointer to point to an array of addresses, providing a scatter and gather mechanism through non-contiguous areas of memory. A command repeat field may be used to provide a looping mechanism in which a smaller data region may be moved and/or verified with a much larger data region. The DMA engine 140 may also include the ability to use random data as the source of the transfer, and non-repeating random addresses as the destination of the transfer.

The memory sequencer 120 is responsible for controlling the memory interface 122 and the memory being tested. New sequencers 120 are quickly proto-typed due to the programmable nature of the control device 100. The sequencer 120 receives commands from the DMA engine 140 and return data from the memory interface 122. The sequencer 120 outputs the return data to the DMA engine 140. The memory sequencer 120 is responsible for issuing requests to the memory modules (via the memory interface 122). The sequencer 120 is designed to maintain optimum bandwidth using a bank interleaved DDR memory controller scheme.

Clock forwarding is used to transmit data between the DDR SDRAM and the control device 100. A bi-directional data strobe is transmitted, along with data, for use in data capture at the receiver. The strobe is transmitted by the DDR SDRAM during reads and by the memory sequencer 120 during writes. In one embodiment, the strobe is edge-aligned with data for reads and center-aligned with data for writes. Up to four DIMMs of memory are supported, each DIMM may consist of one or two ranks, and each rank is further subdivided into four banks. Transactions are pipelined such that accesses may be made to multiple open banks simultaneously.

The memory sequencer 120 receives memory requests and buffers them until it can process them. The memory interface 122 is the physical interface to/from the DDR DIMMs. The memory interface 122 provides the physical interface for clocks, data masks, strobes, rank selects, memory address, memory commands, and read and write data.

The memory sequencer 120 receives requests from three sources. Two of these are internally generated. One requestor is for refresh requests, the other internally generated request is for requests generated by the configuration space. Requests falling into the configuration space requestor include initialization sequence requests such as the load mode command and memory scrubbing. The third source of requests are external requests from the DMA engine 140. If there is contention on these three requestors, the refresh request has top priority, followed by requests generated by the configuration space, and finally requests from the DMA engine 140.

The memory sequencer 120 also performs address multiplexing to provide a valid row address, column address, and rank/bank address to the memory interface 122. The memory sequencer 120 may operate in auto precharge mode. Auto precharge is activated when a read or write command is issued unless the sequencer 120 detects a valid page one clock prior to command issue. The memory sequencer 120 also performs conflict checking for interleaving the banks of memory. The memory sequencer 120 controls the issuance of all memory commands avoiding issue conflicts, bank conflicts, bus conflicts, and ensuring that memory command issue does not conflict with part timing parameters.

The memory interface 122 provides clock forwarding for command/address and write data. The memory interface 122 uses a four deep read capture FIFO (first in first out) buffer that is clocked with the data strobe from the DIMMs under test or with an internal capture clock. Read data is captured using an internal clock. The memory interface 122 also provides complimentary command clocks for each DDR SDRAM DIMM. The command clocks are centered in the command/address window.

The PCI interface 130 serves as the program and control port for the control device 100. As illustrated in FIG. 1, the test board 50 is plugged, into a PC host's PCI interface connector 28. The components of control device 100 may be programmed through the PCI interface 130. Similarly, test, status and other data may be sent to the PC host via the PCI interface 130. The PCI interface 130 operates strictly as a PCI target. The PCI interface 130 accepts memory and I/O transactions from the PCI bus on the backplane directed towards the external memory interface, internal memory, and other control units.

The PCI interface 130 is setup to behave strictly as a simple PCI target. In a desired embodiment, the PCI Interface 30 provides a 32-bit bus width at 33 MHz bus speed. The PCI interface 130 decodes configuration writes and reads, I/O writes and reads, and memory writes and reads. Other PCI commands such as the interrupt acknowledge, special cycle, memory read multiple, memory read line, memory write and invalidate may be supported if desired.

PCI requests that are decoded by the PCI interface 130 produce internal requests to several possible destinations. Each PCI configuration cycle is forwarded to one of three PCI configuration spaces: a PCI interface manager within the PCI interface 130, the memory sequencer 120, or configuration and control block 124. Each PCI I/O or PCI memory cycle, falling within the specified base address ranges, is forwarded to either the PCI access port of the DMA engine 140 or the capture analyzer listing buffer 104.

The clock 70 (FIG. 2) may be driven from programmable delay lines (e.g., DLL 102). The configuration and control block 124 is able to adjust the delay lines during testing and may also determine the size of the data and address eyes. Reference and supply voltages may also be controlled by the configuration and control block 124 and margining may also be determined.

The capture analyzer listing buffer 104 is a tool intended to function much like a logic analyzer does. Read transactions from the external memory modules are monitored and recorded for later diagnostic examination. The capture analyzer listing buffer 104 memory space is used to access two internal storage structures a data buffer and an address buffer.

The capture analyzer listing buffer 104 can be set up through I/O registers to start collecting information from the memory sequencer 120. In addition to this ability to be manually turned on/off, the capture analyzer listing 104 can also be configured to trigger on system events in order to stop capturing new data. This ability to stop the data collection process will allow the user to access the buffers and observe the data history and determine the point of failure in an attempt to resolve the desired issue. It is also possible to use the information collected for performance tuning of the system by looking at the timestamp information recorded with each transaction in the buffers.

As indicated above, the capture analyzer listing buffer 104 contains a data buffer and an address buffer. Each 32 Byte row in the data buffer contains the read data from a whole or partial read request captured from the memory sequencer 120. Each 8-byte row in the address buffer contains the captured address of the read request, read data timestamp, address timestamp, and validity information. The read data corresponds to the data from the serviced read request that was captured in the memory sequencer 120. The address is the corresponding address associated with the read data. The data timestamp is a count that gives the relative time the data was captured. Similarly, the address timestamp is a count giving the relative time the address was captured. The validity information tells whether or not the current buffer location contains a valid address and gives the transfer count for the captured memory transaction. This information may be transferred to the two IRAs 142, 144 and/or the address and data buffers 146, 148 if so desired.

The capture analyzer listing buffer 104 determines what to access by the command and address specified. Exemplary command and address combinations include: I/O write, I/O read and memory read. The data buffer is organized in 64 rows of 32-bytes apiece, which corresponds to the width of one memory transaction.

With this configuration, the control device 100 and its main components (an embedded programmable DMA engine/controller 140, memory sequencer 120, PCI interface 130 and configuration and control component 124) can initiate numerous tests designed to analyze data and address eyes and voltage margins. It should be appreciated that any test suitable for the evaluation of any desired memory, memory interface, power supply, or reference voltage may be used by the control device 100. The test data and information can be stored in the control device 100 in any of its various forms of memory (including the CAL 104) or transferred out to the PC host. Because the control device 100 is easily re-programmable, any necessary adjustments may be made rather easily. That is, the same board may be "re-proto-typed" without the expense of designing and manufacturing a new physical test board.

Figure 5:
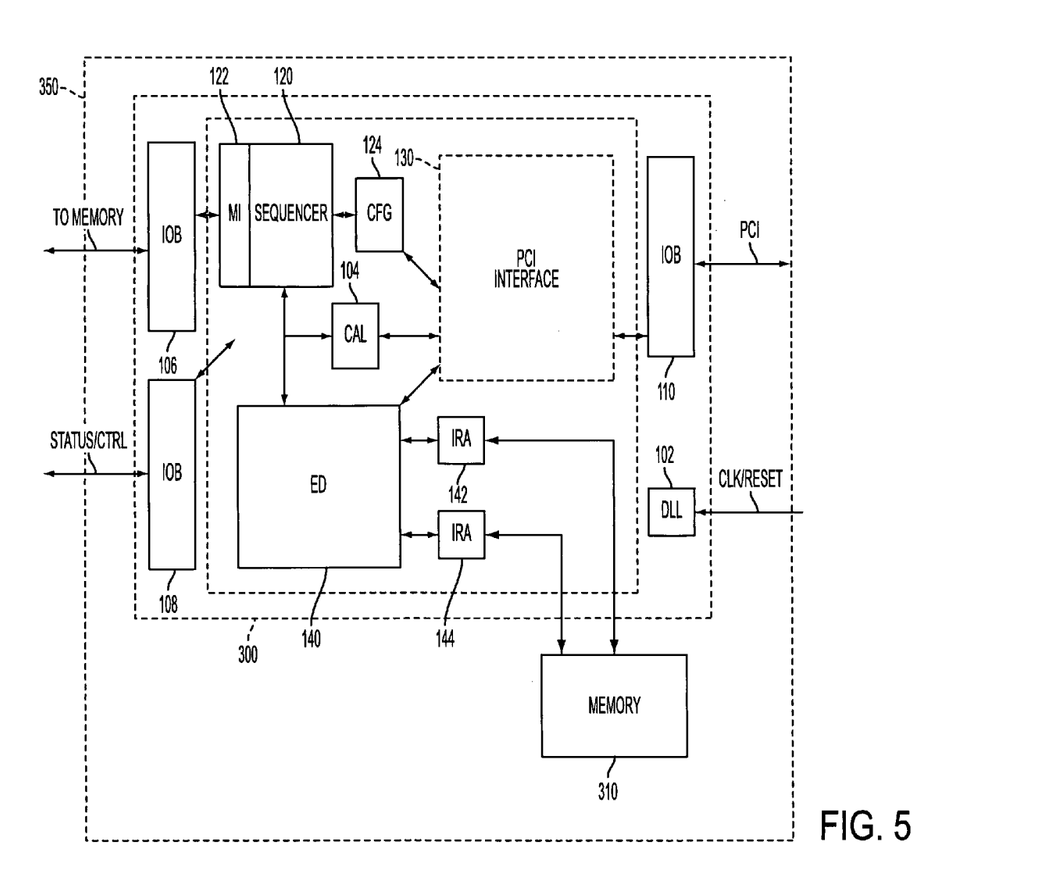
FIG. 5 is a block diagram illustrating another exemplary test circuit board implementing another control device constructed in accordance with an embodiment of the invention.

FIG. 5 is a block diagram illustrating another exemplary test circuit board 350 implementing another control device 300 constructed in accordance with an embodiment of the invention. In this embodiment, the control device 300 does not contain its own address and data buffers. Instead, external memory 310 is used to serve as the address and data buffers. The external memory device 310 can be an SRAM or DRAM and would be much larger than the address and data buffers used in the control device 100 illustrated in FIG. 3.

This allows the DMA engine 140 to store more patterns and other types of information than was possible in the embodiment illustrated in FIG. 3. It should be noted that only a single memory device 310 is illustrated in FIG. 5, but it should be appreciated that more than one memory device 310 could be used. For example, the invention could use one memory device 310 connected to the first IRA 142 that would be dedicated for address information. Similarly, the invention could use one memory device 310 connected to the second IRA 144 that would be dedicated for data information.

Figure 6:
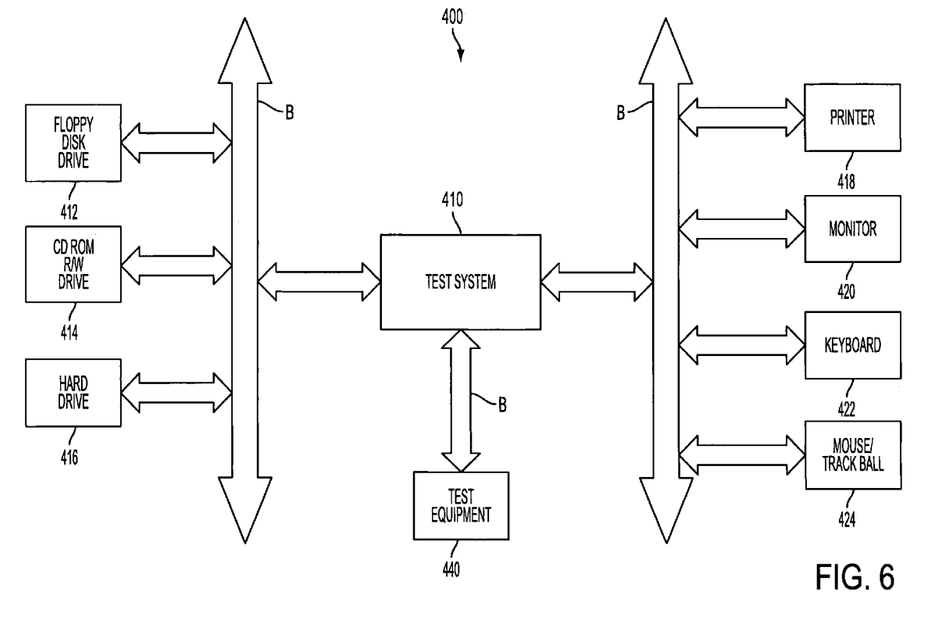
FIG. 6 is a diagram illustrating another exemplary test system constructed in accordance with an embodiment of the invention.

FIG. 6 is a diagram illustrating another exemplary test system 400 constructed in accordance with an embodiment of the invention. The system 400 uses a test sub-system 410 that utilizes a test board 50, 350 (FIGS. 3, 5) and a backplane 20 (FIG. 1) constructed in accordance with one of the embodiments of the invention. The sub-system 410 may be connected to storage devices such as a floppy disk drive 412, read/write CD ROM drive 414 or a hard disk drive 416 via a bus B. The test subsystem 410 may also be connected to peripheral devices such as a printer 418, monitor 420, a keyboard 422, mouse or track ball 424, or any other desirable input/output device. Test equipment 440 suitable for probing, programming or testing a memory device may also be connected to the test sub-system 410.

It should be appreciated that the test boards 50, 350 illustrated in FIGS. 1 and 5 could be made without memory modules 60 on them. It is possible to use the boards 50, 350 as a test vehicle for existing memory modules or the modules of other manufacturers. The memory modules would need to be plugged into one of the test boards 50, 350 and the appropriate control device 100, 300 would have to be programmed in accordance with the specifications of the plug-in memory modules. Once the control device 100, 300 is programmed, the plug-in modules could be stressed, tested and evaluated as described above. The ease at which the control devices 100, 300 may be reprogrammed makes it rather easy to adapt the test boards 50, 350 for any memory technology.

While the invention has been described and illustrated with reference to exemplary embodiments, many variations can be made and equivalents substituted without departing from the spirit or scope of the invention. Accordingly, the invention is not to be understood as being limited by the foregoing description, but is only limited by the scope of the appended claims.

What is claimed as new and desired to be protected by Letters Patent of the United States is:

1. A programmable control circuit for testing a memory device, said control circuit comprising:
   a programmable memory engine, said memory engine generating and outputting requests used to test the memory device;
   a memory sequencer electrically connected to said memory engine, said memory sequencer having a first output electrically connected to the memory device, said sequencer using said first output to test the memory device in response to said requests received from said memory engine, said memory sequencer having an input for receiving test result data from the memory device and a second output for outputting the test result data; and
   a capture analyzer circuit electrically connected to said memory engine and said second output, said capture analyzer circuit inputting and storing the test result data from the second output of said memory sequencer.

2. The control circuit of claim 1 further comprising a host computer interface electrically connected to said memory engine, memory sequencer and said capture analyzer circuit, said host computer interface allowing information and data within said control circuit to be output to a host computer connected to said interface.

3. The control circuit of claim 2, wherein said host computer interface allows said control circuit to input information and data from the host computer.

4. The control circuit of claim 2, wherein said host computer interface is a peripheral component interconnect interface.

5. The control circuit of claim 1 further comprising a configuration and control component for configuring and controlling components within said control circuit.

6. The control circuit of claim 5, wherein said configuration and control component configures and controls delay lines connected to receive a clock signal.

7. The control circuit of claim 5, wherein said configuration and control component configures and controls voltage sources used by the memory device.

8. The control circuit of claim 1 further comprising internal memory arrays connected to said memory engine, wherein said memory engine copies the test result data within said capture analyzer circuit to said internal memory arrays.

9. The control circuit of claim 1 further comprising an address buffer electrically connected to said memory engine, said address buffer comprising address test patterns for testing the memory device, wherein said memory engine outputs the address test patterns to said memory sequencer such that said memory sequencer tests the memory device using the address test patterns.

10. The control circuit of claim 1 further comprising a data buffer electrically connected to said memory engine, said data buffer comprising data test patterns for testing the memory device, wherein said memory engine outputs the data test patterns to said memory sequencer such that said memory sequencer tests the memory device using the data test patterns.

11. The control circuit of claim 1, wherein said memory engine is a programmable direct memory access controller.

12. The control circuit of claim 11, wherein said memory engine performs random request spacing.

13. A test circuit board comprising:
   a memory device; and
   a programmable control circuit electrically connected to said memory device, said control circuit comprising:
      a programmable memory engine, said memory engine generating and outputting requests used to test the memory device,
      a memory sequencer electrically connected to said memory engine, said memory sequencer having a first output electrically connected to the memory device, said sequencer using said first output to test the memory device in response to said requests received from said memory engine, said memory sequencer having an input for receiving test result data from the memory device and a second output for outputting the test result data, and
      a capture analyzer circuit electrically connected to said memory engine and said second output, said capture analyzer circuit inputting and storing the test result data from the second output of said memory sequencer.

14. The test circuit board of claim 13, wherein said control circuit further comprises a host computer interface electrically connected to said memory engine, memory sequencer and said capture analyzer circuit, said host computer interface allowing information and data within said control circuit to be output to a host computer connected to said interface.

15. The test circuit board of claim 14, wherein said host computer interface allows said control circuit to input information and data from the host computer.

16. The test circuit board of claim 14, wherein said host computer interface is a peripheral component interconnect interface.

17. The test circuit board of claim 13, wherein said control circuit further comprises a configuration and control component for configuring and controlling components on said circuit board.

18. The test circuit board of claim 17, further comprising:
a clock; and
delay lines connected to receive clock signals from said clock,
wherein said configuration and control component configures and controls said delay lines to alter a timing of said test circuit board.

19. The test circuit board of claim 17, further comprising a voltage source connected to said test circuit board and said memory device, wherein said configuration and control component configures and controls said voltage source.

20. The test circuit board of claim 19, wherein said voltage source is a supply voltage.

21. The test circuit board of claim 19, wherein said voltage source is a reference voltage generator.

22. The test circuit board of claim 13, wherein said control device further comprises internal memory arrays connected to said memory engine, and wherein said memory engine copies the test result data within said capture analyzer circuit to said internal memory arrays.

23. The test circuit board of claim 13, wherein said control device further comprises an address buffer electrically connected to said memory engine and said address buffer comprises address test patterns for testing the memory device, wherein said memory engine outputs the address test patterns to said memory sequencer such that said memory sequencer tests the memory device using the address test patterns.

24. The test circuit board of claim 13, wherein said control device further comprises a data buffer electrically connected to said memory engine and said data buffer comprised data test patterns for testing the memory device, wherein said memory engine outputs the data test patterns to said memory sequencer such that said memory sequencer tests the memory device using the data test patterns.

25. The test circuit board of claim 13, wherein said memory engine is a programmable direct memory access controller.

26. The test circuit board of claim 25, wherein said memory engine performs random request spacing.

27. The circuit board of claim 13, wherein said memory device is a double data rate synchronous dynamic random access memory.

28. The test circuit board of claim 13 further comprising a test connector for receiving control information from an external device.

29. The test circuit board of claim 28, wherein said control circuit uses said test connector to output data to the external device.

30. The test circuit board of claim 28, wherein said control circuit uses said test connector to output status information to the external device.

31. The test circuit board of claim 13, wherein said control device is an field programmable gate array device.

32. A test circuit board comprising:
a memory device; and
a programmable control circuit electrically connected to said memory device, said control circuit capable of controlling and testing said memory device and inputting test result data from said memory device to evaluate characteristics of said memory device, said control circuit being re-programmable to modify the characteristics of said memory device and the manner in which said control circuit controls said memory device.

33. A test system comprising:
a computer backplane; and
a test circuit board electrically connected to said backplane, said test circuit board comprising:
a memory device, and
a programmable control circuit electrically connected to said memory device, said control circuit capable of controlling and testing said memory device and inputting test result data from said memory device to evaluate characteristics of said memory device, said control circuit outputting the test result data to said backplane,
wherein said control circuit is re-programmable to modify the characteristics of said memory device and the manner in which said control circuit controls said memory device.

34. The test system of claim 33 further comprising a monitor connected to said backplane for displaying the test result data.

35. The test system of claim 33 further comprising a printer connected to said backplane for printing the test result data.

36. The test system of claim 33 further comprising a storage device connected to said backplane for storing the test result data.

37. A test system comprising:
a computer backplane; and
a test circuit board electrically connected to said backplane, said test circuit board comprising a memory device and a programmable control circuit electrically connected to said memory device, said control circuit comprising:
a programmable memory engine, said memory engine generating and outputting requests used to test the memory device,
a memory sequencer electrically connected to said memory engine, said memory sequencer having a first output electrically connected to the memory device, said sequencer using said first output to test the memory device in response to said requests received from said memory engine, said memory sequencer having an input for receiving test result data from the memory device and a second output for outputting the test result data, and
a capture analyzer circuit electrically connected to said memory engine and said second output, said capture analyzer circuit inputting and storing the test result data.

38. The test system of claim 37 further comprising a monitor connected to said backplane for displaying the test result data.

39. The test system of claim 37 further comprising a printer connected to said backplane for printing the test result data.

40. The test system of claim 37 further comprising a storage device connected to said backplane for storing the test result data.

* * * * *